US008610232B2

(12) United States Patent  (10) Patent No.: US 8,610,232 B2
Coe-Sullivan et al.  (45) Date of Patent: Dec. 17, 2013

(54) HYPERSPECTRAL IMAGING DEVICE

(75) Inventors: Seth Coe-Sullivan, Belmont, MA (US);
 Gregory V. Moeller, Ashland, MA (US)

(73) Assignee: QD Vision, Inc., Lexington, MA (US)

( * ) Notice: Subject to any disclaimer, the term of this patent is extended or adjusted under 35 U.S.C. 154(b) by 618 days.

(21) Appl. No.: 12/284,462

(22) Filed: Sep. 22, 2008

(65) Prior Publication Data

US 2009/0174022 A1   Jul. 9, 2009

Related U.S. Application Data

(63) Continuation of application No. PCT/US2007/007424, filed on Mar. 26, 2007.

(60) Provisional application No. 60/785,786, filed on Mar. 24, 2006.

(51) Int. Cl.
 *H01L 31/00*   (2006.01)

(52) U.S. Cl.
 USPC ............... 257/448; 257/90; 438/63; 977/774

(58) Field of Classification Search
 USPC ............ 257/9, 13, 89, 90, 440–442, 431, 257/E33.076, E31.022, E31.054; 438/63; 977/774
 See application file for complete search history.

(56) References Cited

U.S. PATENT DOCUMENTS

| | | | |
|---|---|---|---|
| 5,238,607 A | 8/1993 | Herron et al. | |
| 5,354,707 A | 10/1994 | Chapple-Sokol et al. | |
| 5,512,131 A | 4/1996 | Kumar et al. | |
| 5,527,386 A | 6/1996 | Statz | |
| 5,534,056 A | 7/1996 | Kuehule et al. | |
| 5,537,000 A * | 7/1996 | Alivisatos et al. | 313/506 |
| 5,888,885 A | 3/1999 | Xie | |
| 6,005,707 A | 12/1999 | Berggren et al. | |
| 6,114,038 A | 9/2000 | Castro et al. | |
| 6,117,529 A * | 9/2000 | Leising et al. | 428/209 |
| 6,139,626 A | 10/2000 | Norris et al. | |
| 6,180,239 B1 | 1/2001 | Whitesides et al. | |
| 6,239,355 B1 * | 5/2001 | Salafsky | 136/250 |
| 6,239,449 B1 | 5/2001 | Fafard et al. | |
| 6,294,401 B1 | 9/2001 | Jacobson et al. | |
| 6,322,901 B1 | 11/2001 | Bawendi et al. | |
| 6,326,144 B1 | 12/2001 | Bawendi et al. | |
| 6,329,668 B1 | 12/2001 | Razeghi | |
| 6,333,110 B1 | 12/2001 | Barbera-Guillem | |
| 6,403,947 B1 | 6/2002 | Hoyt et al. | |
| 6,452,187 B1 * | 9/2002 | Claiborne et al. | 250/370.12 |
| 6,512,172 B1 | 1/2003 | Salafsky et al. | |
| 6,518,168 B1 | 2/2003 | Clem et al. | |
| 6,710,366 B1 | 3/2004 | Lee et al. | |
| 6,730,934 B2 | 5/2004 | Yamada et al. | |

(Continued)

FOREIGN PATENT DOCUMENTS

WO  WO-01/77678   10/2001
WO  WO-2007/112088   10/2007

OTHER PUBLICATIONS

McDonald et al. ("Solution-processed PbS quantum dot infrared photodetectors and photovoltaics", Nature Materials, vol. 4, Feb. 2005).*

(Continued)

*Primary Examiner* — Phuc Dang

(57) ABSTRACT

An hyperspectral imaging device comprising semiconductor nanocrystals is provided.

24 Claims, 2 Drawing Sheets

(56) References Cited

U.S. PATENT DOCUMENTS

| | | | |
|---|---|---|---|
| 6,821,559 B2 | 11/2004 | Eberspacher et al. | |
| 6,861,722 B2 | 3/2005 | Graetzel et al. | |
| 6,869,545 B2 | 3/2005 | Peng et al. | |
| 6,871,871 B2 | 3/2005 | Scher et al. | |
| 6,906,326 B2 | 6/2005 | Koch et al. | |
| 6,906,339 B2 * | 6/2005 | Dutta | 257/40 |
| 6,927,009 B2 | 8/2005 | Kodama et al. | |
| 6,967,112 B2 | 11/2005 | Maa et al. | |
| 7,087,833 B2 * | 8/2006 | Scher et al. | 136/252 |
| 7,118,627 B2 | 10/2006 | Hine et al. | |
| 7,659,536 B2 * | 2/2010 | Krishna et al. | 257/14 |
| 7,742,322 B2 * | 6/2010 | Sargent et al. | 365/129 |
| 7,746,681 B2 * | 6/2010 | Sargent et al. | 365/129 |
| 2004/0091710 A1 * | 5/2004 | Bawendi et al. | 428/407 |
| 2004/0110002 A1 | 6/2004 | Kim et al. | |
| 2004/0178390 A1 * | 9/2004 | Whiteford et al. | 252/500 |
| 2005/0002635 A1 * | 1/2005 | Banin et al. | 385/147 |
| 2005/0006656 A1 * | 1/2005 | Jain et al. | 257/88 |
| 2005/0017176 A1 | 1/2005 | Koch et al. | |
| 2005/0112376 A1 | 5/2005 | Naasani | |
| 2005/0146258 A1 * | 7/2005 | Weiss et al. | 313/110 |
| 2005/0201963 A1 | 9/2005 | Dutta | |
| 2005/0205879 A1 * | 9/2005 | Fukunaga | 257/80 |
| 2005/0211974 A1 | 9/2005 | Thompson et al. | |
| 2005/0236556 A1 | 10/2005 | Sargent et al. | |
| 2006/0032529 A1 | 2/2006 | Rand et al. | |
| 2006/0043361 A1 * | 3/2006 | Lee et al. | 257/40 |
| 2006/0054863 A1 | 3/2006 | Dai et al. | |
| 2006/0062902 A1 | 3/2006 | Sager et al. | |
| 2006/0097247 A1 | 5/2006 | Kim et al. | |
| 2006/0196375 A1 | 9/2006 | Coe-Sullivan et al. | |
| 2007/0103068 A1 * | 5/2007 | Bawendi et al. | 313/506 |
| 2008/0001167 A1 | 1/2008 | Coe-Sullivan et al. | |
| 2008/0074050 A1 | 3/2008 | Chen et al. | |
| 2009/0152567 A1 * | 6/2009 | Comerford et al. | 257/80 |
| 2009/0181478 A1 | 7/2009 | Cox et al. | |
| 2009/0208753 A1 | 8/2009 | Coe-Sullivan et al. | |
| 2009/0215208 A1 | 8/2009 | Coe-Sullivan et al. | |
| 2009/0215209 A1 | 8/2009 | Anc et al. | |
| 2009/0251759 A1 | 10/2009 | Domash et al. | |
| 2009/0320909 A1 | 12/2009 | Arangeo et al. | |
| 2010/0025595 A1 | 2/2010 | Bawendi et al. | |
| 2010/0132770 A1 | 6/2010 | Beatty et al. | |

OTHER PUBLICATIONS

Hines et al. ("Colloidal PbS Nanocrystals with Size-tunable Near-infrared Emission:Observation of Post-synthesis Self-narrowing of the Particle Size Distribution", Adv. Mater. 2003, 15, No. 21, Nov. 2003).*

Dabbousi et al. ("(CdSe)ZnS Core-Shell Quantum Dots: Synthesis and Characterization of a Size Series of Highly Luminescent Nanocrystallites", J. Phys. Chem. B. 1997, 101, 9463-9475 (no month cited)).*

Arango, Alexi Cosmos, Thesis entitled: "A Quantum Dot Heterojunction Photodetector", Massachusetts Institute of Technology, Feb. 2005.

Bawendi, et al., "Nanocrystal quantum dots for near IR photodetection" (undated).

Bulovic, V. et al., *Nature* 1996, 380, 29.

Bundas, et al., "Two-color quantum well infrared photodetector focal plan arrays", Proceedings of SPIE, vol. 6206, pp. 62060G (2006).

Chang, et al. Applied Physics Letters vol. 84, No. 21, May 24, 2004.

Goldberg, et al., "Comparison of HgCdTe and quantum-well infrared photodetector dual-focal plane arrays", Optical Engineering, Jan. 2003, vol. 42, Issue 1, pp. 30-46.

Gu, G. et al., *Appl. Phys. Lett.* 1996, 68, 2606-2608.

Halpert, et al, J. Am. Chem. Soc. 2006, "Synthesis of CdSe/CdTe Nanobarbells".

Hegg, et al., A Nano-scale Quantum Dot Photodetector by Self-Assembly, Proceedings of the SPIE, vol. 6003, pp. 10-18 (2005).

Hines, et al., Adv. Mater. 2003, 15, No. 21, Nov. 4.

Jarosz, et al., Phys. Rev. B 70, 195327 (2004).

Kortan, et al., J. Am. Chem. Soc., vol. 112, 1327 (1990).

Kumar, et al., *Applied Physics Letters*, 63, 2002-2004, (1993).

Liu, Opto-Electron. Rev., 11, No. 1, 2003.

McDonald, et al. "Solution-processed PbS quantum dot infrared photodetectors and photovoltaics", Nature Materials, vol. 4, Feb. 2005, pp. 138-142, with supplementary figures.

Microimiages, Inc., "Introduction to Hyperspectral Imaging" with TNTmips, (introduction dated Jul. 14, 2006).

Murray, et al., J. Am. Chem. Soc., vol. 115, 8706 (1993).

Murray, Christopher "Synthesis and Characterization Monodisperse Nanocrystals and Close-Packed Nanocrsytal Assemblies", Annu. Rev. Mater. Sci., 2000, 30, 545-610.

Oertel, et al., Appl. Phys. Lett. 87, 213505 (2005).

Porter, et al., Phys. Rev. B 73 155303 (2006).

Qi, et al., "Efficient Polymer Nanocrystal Quantum-Dot Photodetectors", Appl. Phys. Lett. 86 093103 (2005).

Rogalski, "Optical detectors for focal plane arrays", Opto-Electronics Review 12(2), 221-245 (2004).

Santhanam, et al., *Nano Letters*, 4, 41-44, (2004).

Sargent, "Infrared Quantum Dots", Adv. Mater. 2005, 17, No. 5, Mar. 8, pp. 515-522.

Steckel, Jonathan S., Thesis entitled: "The Synthesis of Inorganic Semiconductor Nanocrystalline Materials Foe the Purpose of Creating Hybrid Organic/Inorganic Light-Emitting Devices", Massachusetts Institute of Technology, Sep. 2006.

Talapin, et al., Science vol. 310 Oct. 2005.

* cited by examiner

HYPERSPECTRAL IMAGING DEVICE

This application is a continuation of commonly owned PCT Application No. PCT/US2007/007424 filed 26 Mar. 2007, which was published in the English language as PCT Publication No. WO/2007/112088 on 4 Oct. 2007. The PCT Application claims priority from commonly owned U.S. Application No. 60/785,786 filed 24 Mar. 2006. The disclosures of each of these applications are hereby incorporated herein by reference in their entireties.

TECHNICAL FIELD OF THE INVENTION

This invention relates generally to the field of imaging and more specifically to hyperspectral imaging.

BACKGROUND OF THE INVENTION

Typical single-crystal inorganic photodetectors can suffer from a basic tradeoff of absorption cross-section for background noise. For each unit thickness of absorbing bulk inorganic material, the possibility of a thermally generated electron-hole pairs increases. These thermally generated charge carriers contribute to the dark current of a photodetector device, and thus require the devices to be operated at extremely low temperatures to suppress this dark current, and increase the detectivity ($D^*$) of the device. The size and power-consumption attributes of equipment for cooling typical existing detectors have hindered the development of compact multi-color ("hyperspectral") imaging system, and limit system efficacy by confining the existing detectors to large sized platforms.

SUMMARY OF THE INVENTION

In accordance with one aspect of the invention, there is provided an hyperspectral imaging device comprising an array of semiconductor nanocrystals.

Preferably, at least a portion of the semiconductor nanocrystals are engineered to generate an electrical output in response to absorption of a light wavelength to be detected.

In accordance with other aspects of the invention, there are provided a method of making and using such devices.

The foregoing, and other aspects described herein all constitute embodiments of the present invention.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

The attached figures are simplified representations presented for purposed of illustration only; the actual structures may differ in numerous respects, including, e.g., relative scale, etc.

For a better understanding to the present invention, together with other advantages and capabilities thereof, reference is made to the following disclosure and appended claims in connection with the above-described drawings.

DETAILED DESCRIPTION OF TH INVENTION

In accordance with one aspect of the invention, there is provided an hyperspectral imaging device comprising an array of semiconductor nanocrystals.

Preferably, at least a portion of the semiconductor nanocrystals are engineered to generate an electrical output in response to absorption of light having the wavelength to be detected, e.g., infrared light, visible, ultraviolet, etc.

The array of semiconductor nanocrystals is preferably disposed as a layer of semiconductor nanocrystals arranged in a pattern. The pattern can optionally including repeating sub-patterns. The pattern can include semiconductor nanocrystals arranged to detect a plurality of different wavelengths or wavelength bands, e.g., from 1 to 100, from 1 to 10, from 3 to 10, different wavelengths or wavelength bands.

In one example of a detailed aspect of the invention, the hyperspectral imaging device comprises two electrodes (e.g., anode and cathode) disposed on a substrate with an array of semiconductor nanocrystals disposed therebetween.

Figure 1:
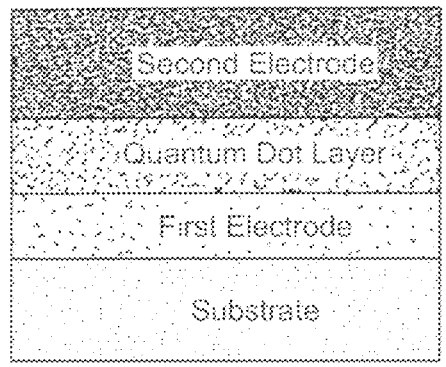
FIGS. 1 and 2 illustrate schematic drawings depicting a cross section of different examples of photodetector structures for use in an embodiment of a hyperspectral device.

FIG. 1 illustrates a schematic drawing depicting a cross section of an example of photodetector-pixel structure of a hyperspectral imaging device. The example depicted in FIG. 1 includes semiconductor nanocrystals between the two electrodes. As discussed herein, the semiconductor nanocrystals are selected based upon the wavelength of electromagnetic radiation to be absorbed by the semiconductor nanocrystal when exposed thereto.

In a preferred embodiment, the semiconductor nanocrystals included in the array are compacted, by for example, solution phase treatment with n-butyl amine after being deposited. See, for example, Oertel, et al., Appl. Phys. Lett. 87, 213505 (2005). See also Jarosz, et al., Phys. Rev. B 70, 195327 (2004); and Porter, et al., Phys. Rev. B 73 155303 (2006). Such compacting can increase the exciton dissociation efficiency and charge-transport properties of the deposited semiconductor nanocrystals.

In a hyperspectral imaging device, the array of semiconductor nanocrystals is preferably included as a patterned layer between the first layer and the second layer.

Figure 2:
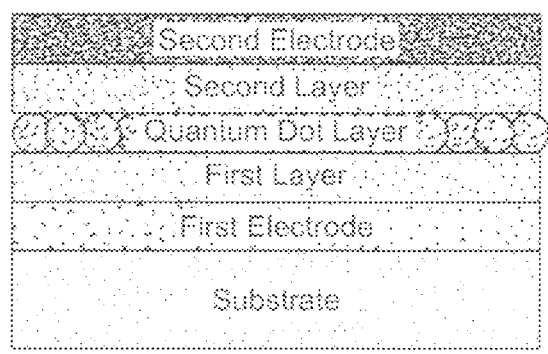

In the example of a photodetector-pixel structure depicted in FIG. 2, the structure includes a first electrode, an optional first layer, an array of semiconductor nanocrystals (referred to as "quantum dot layer" in FIGS. 1 and 2); an optional second layer, and a second electrode.

The structure depicted in FIG. 2 may be fabricated as follows. A substrate having a first electrode (e.g., an anode (for example, PEDOT)) disposed thereon may be obtained or fabricated using any suitable technique. The first electrode may optionally be patterned. A first layer (e.g., comprising a material capable of transporting holes (for example TPD)) may be deposited using any suitable technique. An array comprising semiconductor nanocrystals can be deposited by techniques known or readily identified by one skilled in the relevant art. A second layer (e.g., comprising a material capable of transporting electrons (for example, Alq-3)) may be deposited using any suitable technique. A second electrode (e.g., a cathode (for example, a metal) may be deposited using any suitable technique.

In the example shown in FIG. 2, the electromagnetic radiation to be absorbed passes through the bottom of the structure. If an adequately light transmissive top electrode is used, the structure could also absorb electromagnetic radiation through the top of the structure. Alternatively, the structure of FIG. 2 can be inverted.

The simple layered structures illustrated in FIGS. 1 and 2 are provided by way of non-limiting example, and it is understood that embodiments of the invention may be used in connection with a wide variety of other structures. The specific materials and structures described herein are exemplary in nature, and other materials and structures may be used. Functional photodetector-pixels may be achieved by combining the various layers described in different ways, or layers may be omitted entirely, based on design, performance, and cost factors. Other layers not specifically described may also be included. Materials other than those specifically described may be used. Optionally, one or more of the layers can be patterned. For example, patterned layers comprising electrode material or a charge transport material can be deposited by vapor deposition using shadow masks or other masking techniques.

Optionally, a protective glass layer that can be used to encapsulate the device. Optionally a desiccant or other moisture absorptive material can be included in the device before it is sealed, e.g., with an epoxy, such as a UV curable epoxy. Other desiccants or moisture absorptive materials can be used.

The substrate can be opaque or transparent. An example of a suitable substrate includes a transparent substrate such as those used in the manufacture of a transparent light emitting device. See, for example, Bulovic, V. et al., Nature 1996, 380, 29; and Gu, G. et al., Appl. Phys. Lett. 1996, 68, 2606-2608, each of which is incorporated by reference in its entirety. The substrate can comprise plastic, metal, glass, or a semiconductor material (e.g., silicon, silicon carbide, germanium, etc.). The substrate can be rigid or flexible.

The substrate can have direct or indirect integration to electronics. In certain embodiments, the substrate can include preamplifiers integrated to the array of semiconductor nanocrystals. For example, preamplifiers can be configured to individual pixel-detector elements comprising features of the patterned array.

The first electrode can be, for example, a high work function conductor capable of conducting holes, e.g., comprising a hole-injecting or hole-receiving conductor, such as an indium tin oxide (ITO) layer. Other first electrode materials can include gallium indium tin oxide, zinc indium tin oxide, titanium nitride, or polyaniline. The second electrode can be, for example, a low work function (e.g., less than 4.0 eV) conductor capable of conducting electrons, e.g., comprising an electron-injecting or electron-receiving material, e.g., a metal, such as Al, Ba, Yb, Ca, a lithium-aluminum alloy (Li:Al), or a magnesium-silver alloy (Mg:Ag). The first electrode can have a thickness of about 500 Angstroms to 4000 Angstroms. The second electrode can have a thickness of about 50 Angstroms to greater than about 1000 Angstroms.

Preferably, at least one electrode is at least partially light-transmissive, and more preferably transparent, to the one or more wavelengths to be detected by the semiconductor nanocrystals included in the array. In embodiments for detecting more than one wavelength, the array includes semiconductor nanocrystals engineered to absorb each of the wavelengths to be detected.

Preferably, at least one surface of the device is light-transmissive. For example, if the substrate of the display is opaque, a material that is transmissive to light is preferably used for forming the top electrode of the device. Examples of electrode materials useful for forming an electrode that can at least partially transmit light in the visible region in the spectrum include conducting polymers, indium tin oxide (ITO) and other metal oxides, low or high work function metals, or conducting epoxy resins that are at least partially light transmissive. When a transparent electrode is desired, the electrode preferably is formed from a thin layer of electrode material, e.g., high work function metal, of a thickness that is adequately transparent and conductive. An example of a conducting polymer that can be used as an electrode material is poly(ethlyendioxythiophene), sold by Bayer AG under the trade mark PEDOT. Other molecularly altered poly(thiophenes) are also conducting and could be used, as well as emaraldine salt form of polyaniline.

In one example of a more detailed aspect of the invention, the hyperspectral imaging device can further include at least one charge transport layer, preferably a hole transport layer, disposed between the two electrodes. In another example of a more detailed aspect of the invention, the hyperspectral imaging device can still further include first and second charge transport layers disposed between the two electrodes.

A charge transport layer can comprise a material capable of transporting holes or a material capable of transporting electrons. In embodiments of the device which include a first charge transport layer and a second transport layer, preferably one of the transport layers comprises a material capable of transporting holes and the other comprises a material capable of transporting electrons. More preferably, the charge transport layer comprising a material capable of transporting holes is proximate to the electrode comprising a high work function hole-injecting or hole-receiving conductor and the charge transport layer comprising a material capable of transporting electrons is proximate to the electrode comprising a low work function electron-injecting or electron-receiving conductor. For example, in reverse biased device embodiments including an HTL, the HTL transports holes from the semiconductor nanocrystals to the anode.

The array of semiconductor nanocrystals can be included in a charge transport layer or can be preferably disposed as a layer over a charge transport layer.

In certain embodiments, the hyperspectral imaging device comprises two electrodes and includes an array of semiconductor nanocrystals, a hole transport layer and an electron transport layer disposed between the electrodes. The array of semiconductor nanocrystals can be included in the hole transport layer, in the electron transport layer, or preferably disposed as a layer between the hole transport layer and the electron transport layer.

In certain embodiments, a first charge transport layer can have a thickness of about 50 Angstroms to about 5 micrometers, such as a thickness in the range of 100 Angstroms to 100 nm, 100 nm to 1 micrometer, or 1 micrometer to 5 micrometers. An optional second charge transport layer can have a thickness of about 50 Angstroms to about 5 micrometers, such as a thickness in the range of 100 Angstroms to 100 nm, 100 nm to 1 micrometer, or 1 micrometer to 5 micrometers.

A charge transport layer (e.g., a hole transport layer (HTL) or an electron transport layer (ETL)) can include an inorganic material or an organic material. If two charge transport layers are included (e.g., an HTL and an ETL) either or both can include organic material and either or both can include an inorganic material.

Examples of inorganic material include, for example, inorganic semiconductors. The inorganic material can be amorphous or polycrystalline. An organic charge transport material can be polymeric or non-polymeric.

An example of a typical organic material that can be included in an electron transport layer includes a molecular matrix. The molecular matrix can be non-polymeric. The molecular matrix can include a small molecule, for example, a metal complex. For example, the metal complex of 8-hydoryquinoline can be an aluminum, gallium, indium, zinc or magnesium complex, for example, aluminum tris(8-hydroxyquinoline) (Alq$_3$). In certain embodiments, the electron transport material can comprise LT-N820 available from Luminescent Technologies, Taiwan. Other classes of materials in the electron transport layer can include metal thioxinoid compounds, oxadiazole metal chelates, triazoles, sexithiophenes derivatives, pyrazine, and styrylanthracene derivatives. An electron transport layer comprising an organic material may be intrinsic (undoped) or doped. Doping may be used to enhance conductivity. See, for example, U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

An examples of a typical organic material that can be included in a hole transport layer includes an organic chromophore. The organic chromophore can include a phenyl amine, such as, for example, N,N'-diphenyl-N,N'-bis(3-methylphenyl)-(1,1'-biphenyl)-4,4'-diamine (TPD). Other hole transport layer can include spiro-TPD, 4-4'-N,N'-dicarbazolyl-biphenyl (CBP), 4,4-bis[N-(1-naphthyl)-N-phenylamino]biphenyl (NPD), etc., a polyaniline, a polypyrrole, a poly(phenylene vinylene), copper phthalocyanine, an aromatic tertiary amine or polynuclear aromatic tertiary amine, a 4,4'-bis(p-carbazolyl)-1,1'-biphenyl compound, or an N,N,N',N'-tetraarylbenzidine. A hole transport layer comprising an organic material may be intrinsic (undoped) or doped. Doping may be used to enhance conductivity. Examples of doped hole transport layers are described in U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

Organic charge transport layers may be disposed by known methods such as a vacuum vapor deposition method, a sputtering method, a dip-coating method, a spin-coating method, a casting method, a bar-coating method, a roll-coating method, and other film deposition methods. Preferably, organic layers are deposited under ultra-high vacuum (e.g., $\leq 10^{-8}$ torr), high vacuum (e.g., from about $10^{-8}$ torr to about $10^{-5}$ torr), or low vacuum conditions (e.g., from about $10^{-5}$ torr to about $10^{-3}$ torr). Most preferably, the organic layers are deposited at high vacuum conditions of from about $1 \times 10^{-7}$ to about $5 \times 10^{-6}$ torr. Alternatively, organic layers may be formed by multi-layer coating while appropriately selecting solvent for each layer.

Charge transport layers comprising an inorganic semiconductor can be deposited on a substrate at a low temperature, for example, by a known method, such as a vacuum vapor deposition method, an ion-plating method, sputtering, inkjet printing, etc.

For examples of HTL and ETL materials, see U.S. patent application Ser. No. 11/354,185 of Bawendi et al., entitled "Light Emitting Devices Including Semiconductor Nanocrystals", filed 15 Feb. 2006, and U.S. patent application Ser. No. 11/253,595 of Coe-Sullivan et al., entitled "Light Emitting Device Including Semiconductor Nanocrystals", filed 21 Oct. 2005, and U.S. patent application Ser. No. 10/638,546 of Kim et al., entitled "Semiconductor Nanocrystal Heterostructures", filed 12 Aug. 2003, each of which is hereby incorporated by reference herein in its entirety.

Optionally, one or more additional layers can be included between the two electrodes.

Each layer included in the device may optionally comprise one or more layers.

In certain embodiments, an hyperspectral imaging device includes a layer comprising an array of semiconductor nanocrystals with tunable spectral properties arranged to provide detector-pixels having a predetermined pixel density.

The semiconductor nanocrystals of the array are engineered to generate an electrical response or output in response to absorption of light at the wavelength to be detected. For example, upon absorption of the light to be detected, e.g., IR, MIR, a particular visible wavelength, etc., by a semiconductor nanocrystal, a hole and electron pair are generated. The hole and electron are separated by, e.g., application of voltage, before they pair combine in order to generate an electrical response to be recorded. For example, the wavelength of the detected light or radiation can be between 300 and 2,500 nm or greater, for instance between 300 and 400 nm, between 400 and 700 nm, between 700 and 1100 nm, between 1100 and 2500 nm, or greater than 2500 nm. In certain embodiments, detection capability in the range from 1000 nm to 1800 nm, or 1100 nm to 1700 nm, is preferred.

Semiconductor nanocrystals comprise nanometer-scale inorganic semiconductor particles. Semiconductor nanocrystals preferably have an average nanocrystal diameter less than about 150 Angstroms (Å), and more preferably in the range of 12-150 Å. Most preferably the semiconductor nanocrystals have an average nanocrystal diameter in a range from about 2 nm to about 10 nm.

In certain embodiments, semiconductor nanocrystals comprise Group II-VI compounds, Group II-V compounds, Group III-VI compounds, Group III-V compounds, Group IV-VI compounds, Group I-III-VI compounds, Group II-IV-VI compounds, or Group II-IV-V compounds, and/or mixtures and/or alloys thereof, including ternary and quaternary mixtures and/or alloys. Examples include, but are not limited to, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, and/or mixtures and/or alloys thereof, including ternary and quaternary mixtures and/or alloys. In certain embodiments, semiconductor nanocrystals comprise Group IV elements.

Semiconductor nanocrystals can have effective band gaps that range from the near UV to the infrared, from ~350 nm to ~3.0 micron.

In certain embodiments for detecting infrared wavelength radiation, semiconductor nanocrystals comprising PbS, PbSe, InSb, or InAs are preferred. In certain embodiments for detecting visible wavelength radiation, semiconductor nanocrystals comprising Group II-V Compounds and/or mixtures and/or alloys thereof, including ternary and quaternary mixtures are preferred.

In certain embodiments, semiconductor nanocrystals include a "core" of one or more first semiconductor materials, which may be surrounded by an overcoating or "shell" of a second semiconductor material. A semiconductor nanocrystal core surrounded by a semiconductor shell is also referred to as a "core/shell" semiconductor nanocrystal.

For example, the semiconductor nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as semiconductor nanocrystal cores include, but are not limited to, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary mixtures and/or alloys. Examples of materials suitable for use as semiconductor nanocrystal shells include, but are not limited to, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary mixtures and/or alloys.

In certain embodiments, the surrounding "shell" material has a bandgap greater than the bandgap of the core material. In certain embodiments, the shell is chosen so as to have an atomic spacing close to that of the "core" substrate. In certain embodiments, the surrounding shell material has a bandgap less than the bandgap of the core material. In a further embodiment, the shell and core materials can have the same crystal structure.

For further examples of core/shell semiconductor structures, see U.S. application Ser. No. 10/638,546, entitled "Semiconductor Nanocrystal Heterostructures", filed 12 Aug. 2003, which is hereby incorporated herein by reference in its entirety.

The semiconductor nanocrystals are members of a population of semiconductor nanocrystals having a size distribution. In certain embodiments, semiconductor nanocrystals included in the array of a particular structure and composition comprise a monodisperse or substantially monodisperse population of semiconductor nanocrystals. The monodisperse distribution of diameters can also be referred to as a size. Optionally, the monodisperse population of the semiconductor nanocrystals comprising a particular structure and composition can exhibit less than a 15% rms deviation in diameter of the nanocrystals, or less than 10%, or less than 5%.

Preparation and manipulation of semiconductor nanocrystals are described, for example, in U.S. Pat. Nos. 6,322,901 and 6,576,291, and U.S. Patent Application No. 60/550,314, each of which is hereby incorporated herein by reference in its entirety. Additional examples of methods of preparing semiconductor nanocrystal are described in U.S. patent application Ser. No. 11/354,185 of Bawendi et al., entitled "Light Emitting Devices Including Semiconductor Nanocrystals", filed 15 Feb. 2006; U.S. patent application Ser. No. 11/253,595 of Coe-Sullivan et al., entitled "Light Emitting Device Including Semiconductor Nanocrystals", filed 21 Oct. 2005; U.S. patent application Ser. No. 10/638,546 of Kim et al., entitled "Semiconductor Nanocrystal Heterostructures", filed 12 Aug. 2003, referred to above; Murray, et al., J. Am. Chem. Soc., Vol. 115, 8706 (1993); Kortan, et al., J. Am. Chem. Soc., Vol. 112, 1327 (1990); and the Thesis of Christopher Murray, "Synthesis and Characterization of II-VI Quantum Dots and Their Assembly into 3-D Quantum Dot Superlattices", Massachusetts Institute of Technology, September, 1995. Each of the foregoing is hereby incorporated by reference herein in its entirety.

The semiconductor nanocrystals optionally have ligands attached thereto.

In certain embodiments, the ligands are derived from the coordinating solvent used during the growth process. The surface can be modified by repeated exposure to an excess of a competing coordinating group to form an overlayer. For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a suspension or dispersion medium. Such affinity improves the stability of the suspension and discourages flocculation of the semiconductor nanocrystal. In other embodiments, semiconductor nanocrystals can alternatively be prepared with use of non-coordinating solvent(s).

A suitable coordinating ligand can be purchased commercially or prepared by ordinary synthetic organic techniques, for example, as described in J. March, Advanced Organic Chemistry, which is incorporated herein by reference in its entirety. See also U.S. patent application Ser. No. 10/641,292 entitled "Stabilized Semiconductor Nanocrystals", filed 15 Aug. 2003, which is hereby incorporated herein by reference in its entirety. See also the patent applications, which include descriptions of preparation methods, that are listed above.

Semiconductor nanocrystals can have various shapes, including sphere, rod, disk, other shapes, and mixtures of various shaped particles.

Semiconductor nanocrystals can achieve high absorption cross-section per unit thickness.

An example of an hyperspectral imaging device includes a 256×256×15 color array, which operates in the SWIR and MIR bands on a single chip without the need for liquid nitrogen cooling. Such device can be further integrated with conventional silicon based read-out integrated circuit (ROIC) technology. On or off chip amplification can be utilized.

In one embodiment, an hyperspectral imaging device can be useful to provide a compact, portable, multi-color, high-resolution IR imaging system.

While not wishing to be bound by theory, it is believed that inorganic semiconductor nanocrystals can reduce the tradeoff that is fundamental to bulk materials. Through quantum confinement effects, the absorption cross-section of a 5 nm thick layer of semiconductor nanocrystals is increased relative to the cross-section of 5 mm of the same semiconductor material in bulk form. This enhancement allows the use of thinner films to achieve the same absorbance, and thus reduces the quantity of thermally generated charge carriers in the device at the same temperature. The use of thinner films is expected to facilitate the operation of higher sensitivity photodetectors/pixels at higher operating temperatures.

In addition to their potential for increased sensitivity and increased operating temperature, semiconductor nanocrystals provide the advantage of a tunable range of wavelength sensitivities.

As discussed above, by selection of the composition and controlling size, semiconductor nanocrystals can be tuned through a wide range of optical band gaps. For example, PbSe semiconductor nanocrystals can be tuned from 1.1 µm to 2.2 µm just by changing the size of the particle. Changing the semiconductor material permits coarse adjustment of the band gap of the material, enabling materials capable of absorbing in the ultraviolet, visible, near-infrared, and mid-infrared regions of the spectrum.

In fabricating certain embodiments of the device including an electron layer and a hole transport layer, the layers are preferably deposited via physical vapor deposition onto the substrate. The sandwich structure of this embodiment is similar to that of a p-i-n diode, and the layers are deposited sequentially onto the substrate.

In certain embodiments, the array of semiconductor nanocrystals is deposited using contact printing. See, for example, A. Kumar and G. Whitesides, *Applied Physics Letters*, 63, 2002-2004, (1993); and V. Santhanam and R. P. Andres, *Nano Letters*, 4, 41-44, (2004), each of which is incorporated by reference in its entirety. See also U.S. patent application Ser. No. 11/253,612, filed 21 Oct. 2005, entitled "Method And System For Transferring A Patterned Material", of Coe-Sullivan et al. and U.S. patent application Ser. No. 11/253,595, filed 21 Oct. 2005, entitled "Light Emitting Device Including Semiconductor Nanocrystals," of Coe-Sullivan, each of which is incorporated herein by reference in its entirety.

Contact printing provides a method for applying a material to a predefined region on a substrate. The predefined region is a region on the substrate where the material is selectively applied. The material and substrate can be chosen such that the material remains substantially entirely within the predetermined area. By selecting a predefined region that forms a pattern, material can be applied to the substrate such that the material forms a pattern. The pattern can be a regular pattern (such as an array, or a series of lines), or an irregular pattern. Once a pattern of material is formed on the substrate, the substrate can have a region including the material (the predefined region) and a region substantially free of material. In some circumstances, the material forms a monolayer on the substrate. The predefined region can be a discontinuous region. In other words, when the material is applied to the predefined region of the substrate, locations including the material can be separated by other locations that are substantially free of the material.

In some embodiments, contact printing can begin by forming a patterned or unpatterned mold. The mold has a surface with a pattern of elevations and depressions. The stamp can include planar and/or non-planar regions. A stamp is formed with a complementary pattern of elevations and depressions, for example by coating the patterned surface of the mold with a liquid polymer precursor that is cured while in contact with the patterned mold surface. The stamp can then be inked; that is, the stamp is contacted with a material which is to be deposited on a substrate. The material becomes reversibly adhered to the stamp. The inked stamp is then contacted with the substrate. The elevated regions of the stamp can contact the substrate while the depressed regions of the stamp can be separated from the substrate. Where the inked stamp contacts the substrate, the ink material (or at least a portion thereof) is transferred from the stamp to the substrate. In this way, the pattern of elevations and depressions is transferred from the stamp to the substrate as regions including the material and free of the material on the substrate. Microcontact printing and related techniques are described in, for example, U.S. Pat. Nos. 5,512,131; 6,180,239; and 6,518,168, each of which is incorporated by reference in its entirety. In some circumstances, the stamp can be a featureless stamp having a pattern of ink, where the pattern is formed when the ink is applied to the stamp.

Other techniques, methods and applications that may be useful with the present invention are described in, U.S. Provisional Patent Application No. 60/792,170, of Seth Coe-Sullivan, et al., for "Composition Including Material, Methods Of Depositing Material, Articles Including Same And Systems For Depositing Material", filed on 14 Apr. 2006; U.S. Provisional Patent Application No. 60/792,084, of Maria J. Anc, For "Methods Of Depositing Material, Methods Of Making A Device, And System", filed 14 Apr. 2006, U.S. Provisional Patent Application No. 60/792,086, of Marshall Cox, et al, for "Methods Of Depositing Nanomaterial & Methods Of Making A Device" filed 14 Apr. 2006; U.S. Provisional Patent Application No. 60/792,167, of Seth Coe-Sullivan, et al, for "Articles For Depositing Materials, Transfer Surfaces, And Methods" filed 14 Apr. 2006; U.S. Provisional Patent Application No. 60/793,990, of LeeAnn Kim et al., for "Applicator For Depositing Materials And Methods" filed 21 Apr. 2006; and U.S. Provisional Patent Application No. 60/790,393 of Seth Coe-Sullivan et al., for "Methods And Articles Including Nanomaterial", filed on 7 Apr. 2006. The disclosures of each of the foregoing listed provisional patent applications are hereby incorporated herein by reference in their entireties.

Contact printing can be useful for depositing an array of semiconductor nanocrystals of various thicknesses, e.g., from a monolayer thickness to a thickness selected to achieve the desired % absorption of the semiconductor nanocrystal array. Examples of desired % absorptions can include, without limitation, from about 0.01% to about 99%, from about 0.1 to about 99%, from about 1% to about 99%, from about 10% to about 90%, from about 10% to about 50%, from about 50% to about 90%.

Contact printing optionally allows a substantially dry (i.e., substantially liquid or solvent free) application of a patterned semiconductor nanocrystal film to a surface, thus freeing the surface of solubility and surface chemistry requirements.

An array of semiconductor nanocrystals can alternatively be deposited by solution based processing techniques, silk-screening, inkjet printing, and other liquid film techniques available for forming patterns on a surface.

Liquid based deposition techniques utilize one or more colloidal dispersions including the semiconductor nanocrystals to be included in the hyperspectral imaging device. Such deposition method facilitates forming a layer comprising a patterned array of semiconductor nanocrystals having different bandgaps on a single substrate.

In certain embodiments, the array of semiconductor nanocrystals comprises semiconductor nanocrystals dispersed in a material (e.g., a polymer, a resin, a silica glass, silica gel, aerogel, other porous or nonporous matrices, etc.) which is at least partially light-transmissive to the wavelength to be detected, and more preferably transparent, for the wavelength to be detected. Preferably, the material includes from about 10% to about 95% by weight semiconductor nanocrystals. Such dispersion can be deposited as a full or partial layer or in a patterned arrangement by any of the above-listed or other known techniques. Examples of other suitable materials include, for example, polystyrene, epoxy, polyimides, and silica glass. Preferably such dispersions are deposited by solution process technology. After application to the surface, such material desirably contains dispersed semiconductor nanocrystals in an array where the nanocrystals have been selected and arranged by composition, structure, and/or size so as to absorb the light to be detected and to generate an electrical signal or other output in response to the absorbed light. Dispersions of semiconductor nanocrystals in, e.g., polystryrene or epoxy, can be prepared as set forth, for example, in U.S. Pat. No. 6,501,091 or by other suitable techniques. Semiconductor nanocrystals can be deposited at a micron-scale (e.g., less than 1 mm, less than 500 μm, less than 200 μm, less than 100 μm or less, less than 50 μm or less, less than 20 μm or less, less than 10 μm or less) or larger patterning of features on a surface. In certain embodiments, the features have a size in the range from about 10 to about 100 micron. In certain embodiments the features can a size of about 30 microns. Features in the size range from about 10 to about 100 microns are preferred sizes for subpixels features. The surface can have dimensions of 1 cm or greater, 10 cm or greater, 100 cm or greater, or 1,000 cm or greater. Optionally, devices can be stitched (or tiled) together, to expand device sizes from 12" squares, to 'n×12" squares, as is frequently done in the semiconductor lithography field.

Because the semiconductor nanocrystals are disposed in an array, semiconductor nanocrystals of different absorption spectra can be added at different pixel or sub-pixel locations, giving rise to a multispectral array on a single chip. The common cathode can then be deposited over the entire array.

In certain embodiments, two or more different semiconductor nanocrystals (e.g., having different compositions, structures, and/or sizes) can be included. A device including semiconductor nanocrystals of different compositions, sizes, and/or structures can absorb electromagnetic radiation at the wavelengths or wavelength bands characteristic of each of the different compositions. The particular wavelength(s) to be absorbed and detected can be controlled by selecting appropriate combinations of semiconductor nanocrystal compositions, structures, and/or sizes as well as the output to be generated in response to the electromagnetic radiation so absorbed.

In certain embodiments, one or more populations of different semiconductor nanocrystals, each having predetermined absorption characteristics, can be deposited in a patterned arrangement based on the predetermined absorption characteristics desired. The predetermined absorption characteristics of each population can be the same or different from each of any other population included. Patterned semiconductor nanocrystals can be used to form an array of photodetector devices (or pixels) comprising, e.g., red, green, and blue, or alternatively, red, orange, yellow, green, blue-green, blue, violet, or other visible, infrared, or ultraviolet absorbing, or other combinations of distinguishable wavelength absorbing, subpixels that can generate an electrical response indicative of the particular predetermined wavelength or wavelength band absorbed. Preferably, the electrical response can also be indicative of the intensity or relative intensity of the absorbed radiation.

Each photodetector included in the array may also be referred to as a pixel. Each pixel may further include two or more subpixels, each of which may be capable of absorbing electromagnetic radiation having the same or different wavelength as that absorbed by another subpixel included in the pixel.

Advantageously, each layer of the device, other than the semiconductor nanocrystal array layer, can be deposited as a blanket film. No patterning is required of these layers, resulting in low cost manufacturing. In certain embodiments, this permits simple on-silicon integration. Although, in certain embodiments any one or more of the other layers can be patterned.

In certain embodiments, the device is made in a controlled (oxygen-free and moisture-free) environment.

The surface of the device opposite the substrate may optionally be completed by encapsulation with one or more layers of, e.g., polymer, glass, ceramic, and/or metal. When more than one layer is used, the layers may be the same or different materials.

Optionally, the viewing surface of the device can be anti-reflective e.g., by use of antireflective coating(s) or a polarizing filter, e.g., a circular polarizer.

Electrical connections for connecting the device to a power supply can also be included.

A device can optionally further include optics or an optical system to enhance viewability of the device output. Examples of preferred optics for use, for example, with infrared detection include sapphire or germanium lenses FIG. 3 illustrates an example of a possible hyperspectral imaging device structure.

Figure 4:
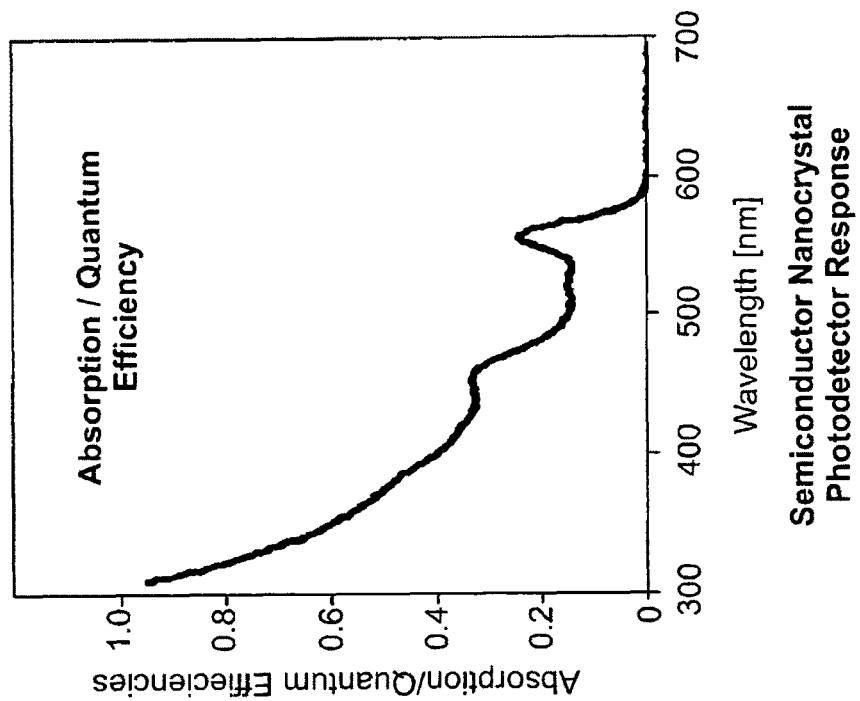
FIG. 4 graphically depicts an example of an expected response of a photodetector including semiconductor nanocrystals.
Figure 3:
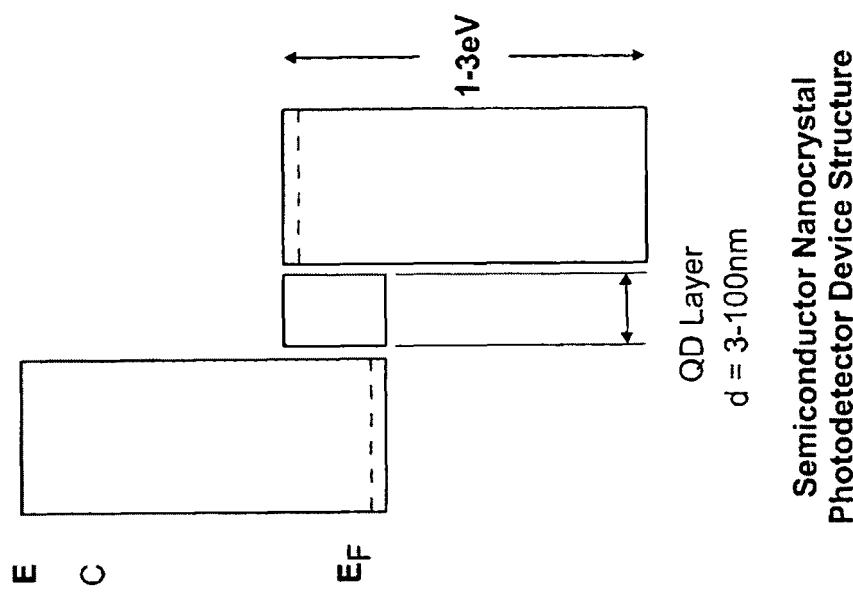
FIG. 3 is a diagram depicting an example of a possible structure of a photodetector (pixel) including semiconductor nanocrystals.

FIG. 4 depicts an expected absorption and photodetector response for a device with a structure shown in FIG. 3 including semiconductor nanocrystals. The expected response is based on a device including semiconductor nanocrystals with a bandgap of 2.2 eV, and containing a core of CdSe which has a bulk bandgap of 1.8 eV. The tuning from 1.8 eV to 2.2 eV is due to the quantum confinement effects, and is dependent on the size of the semiconductor nanocrystals used. The photocurrent of the device is expected to track the absorption spectrum of the semiconductor nanocrystals included in the device.

Unlike epitaxially grown inorganic photodetectors, colloidal semiconductor nanocrystals are not synthesized as part of the device the fabrication process. This enables easy integration to electronics, as well as the integration of multiple wavelength detectors onto a single substrate. The entire device structure (excluding deposition of the semiconductor nanocrystals) can be fabricated using physical vapor deposition of amorphous thin films. Such techniques are standard practice in liquid crystal display (LCD) processing, which takes place over substrates which are up to 2 meters on a side (Gen 7 motherglass).

Because of the diversity of available semiconductor nanocrystal materials, and the wavelength tuning via semiconductor nanocrystal composition and diameter or size, hyperspectral imaging devices can have any predetermined wavelength sensitivity, e.g., from UV to MIR. Semiconductor nanocrystals can be synthesized and stored, and then deposited onto the selected substrate, including, e.g., silicon.

Because of the decreased thermal generation per unit volume in quantum confined materials, semiconductor nanocrystal thin films can offer less noise for the same absorption cross-section.

As discussed above, due to the decrease in thermal noise in hyperspectral imaging devices including semiconductor nanocrystals, it is possible to operate them at elevated temperatures relative to competing technologies involving bulk inorganic materials. This can provide design flexibility in areas of device size and power consumption. Portable hyperspectral imaging devices would be useful for inclusion in an article of manufacture for use in a broader range of applications, e.g., military vehicles, and other platforms.

In certain embodiments, an hyperspectral imaging device comprises an array including a plurality of photodetectors including semiconductor nanocrystals. The array can be disposed on a surface. In certain more detailed embodiments, each photodetector further includes two electrodes with the semiconductor nanocrystals disposed therebetween. Each photodetector can further include at least one charge transport layer, preferably a hole transport layer, disposed between the electrodes. Other optional layers, e.g., a second charge transport layer can further be included.

Examples of a photodetector including semiconductor nanocrystals are described in "A Quantum Dot Heterojunction Photodetector" by Alexi Cosmos Arango, Submitted to the Department of Electrical Engineering and Computer Science, in partial fulfillment of the requirements for the degree of Masters of Science in Computer Science and Engineering at the Massachusetts Institute of Technology, February 2005, the disclosure of which is hereby incorporated herein by reference in its entirety.

Other examples of photodetectors and/or uses thereof are described in Qi, et al., "Efficient Polymer Nanocrystal Quantum-Dot Photodetectors", Appl. Phys. Lett. 86 093103 (2005); Hegg, et al., A Nano-scale Quantum Dot Photodetector by Self-Assembly, Proceedings of the SPIE, Volume 6003, pp. 10-18 (2005); and Rogalski, "Optical Detectors for Focal Plane Arrays", Opto-Electronics Review 12(2) 221-245 (2004). The disclosures of the foregoing publications are hereby incorporated herein by reference in their entirety.

An hyperspectral imaging device can include optics for receiving the light to be absorbed.

A device can include filter means for selectively filtering the light received by the semiconductors of the array or individual photodetectors/pixels.

A device can include electronic means that record the electrical output of each photodetector.

Hyperspectral imaging devices are useful in a wide variety of applications in which photodetectors are used. For example, hyperspectral imaging devices that can detect in the infrared region of the spectrum are useful for soil imaging.

As used herein, "top" and "bottom" are relative positional terms, based upon a location from a reference point. More particularly, "top" means furthest away from the substrate, while "bottom" means closest to the substrate. For example, the bottom electrode is the electrode closest to the substrate, and is generally the first electrode fabricated; the top electrode is the electrode that is more remote from the substrate, on the top side of the array of semiconductor nanocrystals. The bottom electrode has two surfaces, a bottom surface closest to the substrate, and a top surface further away from the substrate. Where, e.g., a first layer is described as disposed or deposited "over" a second layer, the first layer is disposed further away from substrate. There may be other layers between the first and second layer, unless it is otherwise specified. For example, a cathode may be described as "disposed over" an anode, even though there are various other layers in between.

All the patents and publications mentioned above and throughout are incorporated in their entirety by reference herein.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. An hyperspectral imaging device comprising an array comprising two or more populations of semiconductor nanocrystals disposed as a layer arranged in a pattern to provide detector-pixels having a predetermined pixel density, wherein at least a portion of the semiconductor nanocrystals are engineered to generate an electrical output in response to absorption of light having a wavelength to be detected, wherein a detector-pixel comprises semiconductor nanocrystals from a single population of semiconductor nanocrystals with predetermined absorption characteristics.

2. An hyperspectral imaging device in accordance with claim 1 wherein the layer is non-continuous.

3. An hyperspectral imaging device in accordance with claim 1 wherein the patterned layer comprises repeating sub-patterns of semiconductor nanocrystals.

4. An hyperspectral imaging device in accordance with claim 1 wherein a detector-pixel further comprises two electrodes with the semiconductor nanocrystals disposed therebetween.

5. An hyperspectral imaging device in accordance with claim 4 wherein the detector-pixel further comprises at least one charge transport layer disposed between the two electrodes.

6. An hyperspectral imaging device in accordance with claim 5 wherein each charge transport layer comprises one or more layers.

7. An hyperspectral imaging device in accordance with claim 1 wherein semiconductor nanocrystals have a % absorption of from about 1% to about 99%.

8. An article of manufacture including an hyperspectral imaging device in accordance with claim 1.

9. A portable hyperspectral imaging device comprising an hyperspectral imaging device in accordance with claim 1.

10. An hyperspectral imaging device in accordance with claim 1 wherein the semiconductor nanocrystals comprise a core/shell structure.

11. An hyperspectral imaging device in accordance with claim 10 wherein the core comprises a Group II-VI compound, a Group II-V compound, a Group III-VI compound, a Group III-V compound, a Group IV-VI compound, a Group I-III-VI compound, a Group II-IV-VI compound, a Group II-IV-V compound, and mixtures thereof.

12. An hyperspectral imaging device in accordance with claim 11 wherein the shell comprises a Group II-VI compound, a Group II-V compound, a Group III-VI compound, a Group III-V compound, a Group IV-VI compound, a Group I-III-VI compound, a Group II-IV-VI compound, a Group II-IV-V compound, and mixtures thereof.

13. An hyperspectral imaging device in accordance with claim 11 wherein the semiconductor nanocrystals include at least one ligand attached to the surface.

14. An hyperspectral imaging device in accordance with claim 1 wherein the semiconductor nanocrystals include at least one ligand attached to the surface.

15. An hyperspectral imaging device in accordance with claim 1 wherein the semiconductor nanocrystals comprises a Group II-VI compound, a Group II-V compound, a Group III-VI compound, a Group III-V compound, a Group IV-VI compound, a Group I-III-VI compound, a Group II-IV-VI compound, a Group II-IV-V compound, and mixtures thereof.

16. An hyperspectral imaging device in accordance with claim 15 wherein the semiconductor nanocrystals include at least one ligand attached to the surface.

17. An hyperspectral imaging device in accordance with claim 1 wherein the semiconductor nanocrystals comprise colloidal semiconductor nanocrystals.

18. An hyperspectral imaging device in accordance with claim 1 wherein device operates in SWIR and MIR bands on a single chip without the need for liquid nitrogen cooling.

19. An hyperspectral imaging device comprising an array of detector-pixels, wherein a detector-pixel comprises semiconductor nanocrystals from a single population of semiconductor nanocrystals with predetermined absorption characteristics, a hole transport layer and an electron transport layer disposed between two electrodes, and wherein the array is formed from a layer including two or more populations of semiconductor nanocrystals with different predetermined absorption characteristics arranged in a pattern.

20. An hyperspectral imaging device in accordance with claim 19 wherein the detector-pixel comprises semiconductor nanocrystals included in the hole transport layer.

21. An hyperspectral imaging device in accordance with claim 19 wherein the detector-pixel comprises semiconductor nanocrystals disposed as a layer between the hole transport layer and the electron transport layer.

22. An hyperspectral imaging device comprising an array including a plurality of photodetectors including semiconductor nanocrystals, wherein the array is formed from a layer comprising a patterned arrangement of two or more populations of semiconductor nanocrystals, wherein each population has predetermined absorption characteristics, and wherein the patterned arrangement is based on the predetermined absorption characteristics, and wherein each photodetector includes semiconductor nanocrystals from a single population of semiconductor nanocrystals.

23. An hyperspectral imaging device in accordance with claim 22 wherein the semiconductor nanocrystals comprise colloidal semiconductor nanocrystals.

24. An hyperspectral imaging device in accordance with claim 22 wherein device operates in SWIR and MIR bands on a single chip without the need for liquid nitrogen cooling.

* * * * *

UNITED STATES PATENT AND TRADEMARK OFFICE
CERTIFICATE OF CORRECTION

PATENT NO.       : 8,610,232 B2
APPLICATION NO.  : 12/284462
DATED            : December 17, 2013
INVENTOR(S)      : Coe-Sullivan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 704 days.

Signed and Sealed this
Twenty-fourth Day of February, 2015

Michelle K. Lee
*Deputy Director of the United States Patent and Trademark Office*